(12) United States Patent
Baujon et al.

(10) Patent No.: US 11,075,057 B2
(45) Date of Patent: Jul. 27, 2021

(54) DEVICE FOR TREATING AN OBJECT WITH PLASMA

(71) Applicant: Plasma-Therm, LLC, St. Petersburg, FL (US)

(72) Inventors: Gilles Baujon, Paris (FR); Emmanuel Guidotti, Paris (FR); Yannick Pilloux, Perthes (FR); Patrick Rabinzohn, Fillinges (FR); Julien Richard, Gif-sur-Yvettes (FR); Marc Segers, Les Ulis (FR); Vincent Girault, Vernouillet (FR)

(73) Assignee: Plasma-Therm LLC, St. Petersburg, FL (US)

(*) Notice: Subject to any disclaimer, the term of this patent is extended or adjusted under 35 U.S.C. 154(b) by 143 days.

(21) Appl. No.: 15/870,890

(22) Filed: Jan. 13, 2018

(65) Prior Publication Data

US 2018/0158651 A1    Jun. 7, 2018

Related U.S. Application Data

(62) Division of application No. 14/415,976, filed as application No. PCT/FR2013/051768 on Jul. 22, 2013, now abandoned.

(30) Foreign Application Priority Data

Jul. 20, 2012  (FR) ........................................ 1257037

(51) Int. Cl.
*H01J 37/32*    (2006.01)

(52) U.S. Cl.
CPC .. *H01J 37/32082* (2013.01); *H01J 37/32357* (2013.01); *H01J 37/32366* (2013.01); *H01J 37/32403* (2013.01); *H01J 37/32449* (2013.01); *H01J 2237/334* (2013.01); *Y10T 428/24802* (2015.01)

(58) Field of Classification Search
USPC ........ 156/345.48, 345.49; 118/723 I, 723 IR; 315/111.51
See application file for complete search history.

(56) References Cited

U.S. PATENT DOCUMENTS

| | | | | |
|---|---|---|---|---|
| 6,051,073 A | * | 4/2000 | Chu | ...................... H01J 37/321 |
| | | | | 118/723 E |
| 6,267,074 B1 | * | 7/2001 | Okumura | ............ C23C 16/5096 |
| | | | | 118/723 ER |
| 2001/0002584 A1 | * | 6/2001 | Liu | ........................ C23C 14/48 |
| | | | | 118/723 I |
| 2002/0069827 A1 | * | 6/2002 | Sakamoto | ............... C23C 16/24 |
| | | | | 118/723 I |

(Continued)

*Primary Examiner* — Rakesh K Dhingra
(74) *Attorney, Agent, or Firm* — Burr & Forman LLP; Harvey S. Kauget

(57) ABSTRACT

A system for treating an object with plasma includes a vacuum processing chamber having a holder on which the object to be treated is placed, at least two subassemblies each including at least one plasma source able to generate a plasma and being supplied with radio-frequency power Pi and with a gas i of independent flow rate ni. The plasma generated by one of the subassemblies is a partially ionized gas or gas mixture of different chemical nature from the plasma generated by the other subassembly or subassemblies. A process for selectively treating a composite object employing such a device is described.

3 Claims, 10 Drawing Sheets

(56) References Cited

U.S. PATENT DOCUMENTS

2008/0308409 A1* 12/2008 Brcka ............... H01J 37/32082
 204/164
2012/0034394 A1* 2/2012 Shajii ................ H01J 37/32357
 427/571

* cited by examiner

Low pressure and high density plasmas

DEVICE FOR TREATING AN OBJECT WITH PLASMA

CROSS REFERENCES TO RELATED APPLICATIONS

This application is a divisional of U.S. patent application Ser. No. 14/415,976 entitled: Device for Treating an Object with Plasma which claims priority from and is related to commonly owned International Application No. PCT/FR2013/051768 filed Jul. 22, 2013 and French Patent Application No. 1257037 filed Jul. 20, 2012, the entire contents of each are incorporated herein by reference.

BACKGROUND

The invention concerns the domain of plasma surface processing.

By plasma surface processing is understood, in the sense of the present invention, different types of applications.

Applications can notably be cited consisting of the removal (or etching) of materials (and in particular materials such as photosensitive resins, metals, dielectrics or again semiconductors, etc.), the etching of structures such as holes or trenches in a silicon substrate or a layer comprised of metals, dielectrics or other substances, typically following a surface pattern printed in a photosensitive resin by photolithography, or again applications consisting of the removal of sacrificial layers.

Applications can again be cited consisting of the cleaning of residues and of contaminants, or the activation of surfaces (that is the physical and/or chemical modification of the "extreme surface"), or again the passivation of surfaces (that is the protection against physical and/or chemical attack of the latter).

These applications concern notably the micro-electronics and semi-conductor domain, but also e.g. the fabrication of flat screens and photovoltaic panels.

SUMMARY

A plasma is a partially ionized gas containing electrically charged species (ions and electrons) as well as electrically neutral but very chemically active species, free radicals: these are atoms and molecules in an electronically "excited" state but not having lost an electron. By means of these radicals and/or ions and of a controlled vacuum environment, the plasma offers unique possibilities for the depositing, etching and removal of materials.

At the current time, there exist two dominant types of plasma technology for the surface processing of semi-conductors: micro-wave plasmas and inductively coupled plasmas. Each of the present technologies presents advantages and inconveniences.

The principal advantage of micro-wave plasmas comes from their ability to generate a high density of active chemical species (greater than $10^{17}$ cm$^{-3}$). This technology presents numerous inconveniences, however, such as the complexity of the plasma source and the non-uniformity of the processing. The plasma source necessitates the vertical assembly of numerous parts (wave-guide, magnetron, etc.), that generates a significant bulk and renders it unreliable. In addition, the plasma source is positioned upstream (with respect to the gas flow) and in the center of a processing chamber, and this provides insufficient uniformity of the density of active plasma species, and therefore the processing of the substrate (positioned in the processing chamber), between the center of the chamber (where the density of active species is very high) and its edge (where the density of active species is very low). Moreover, this type of plasma source presents the inconvenience of requiring very high electrical power, as well as very high gas flow-rates. All these inconveniences make this plasma process expensive, difficult to make reliable and difficult to control.

Inductively Coupled Plasmas or ICPs are easier to implement than micro-wave plasmas: the technology is simpler, less expensive and more easily controllable than micro-wave technology. However, the principal inconvenience of this technology comes from the low density of chemically active species (about $10^{15}$ cm$^{-3}$) thus obtained. Moreover, like micro-wave plasmas, ICP plasmas suffer from the problem of non-uniformity in the density of active species between the center of the chamber (where the density of active species is higher) and its edge (where the density of active species is lower), that makes the surface processing non-uniform. Processing speeds required by users impose the use of high power RF generators that are very costly and which lead to the heating of the gases used. Lastly, depending upon the design of the processing chamber, the plasma generated by the ICP sources can induce significant ionic bombardment of the substrates (for example semi-conductor wafers) whether voluntarily (RIE mode (reactive ion etching)) or not.

One of the major problems encountered by current plasma technologies is therefore that of the non-uniformity of the density of active species and consequently that of the design of a device adapted to the increase in size of substrates (or scale-up). In fact, the passage from 200 mm diameter substrates to 300 mm diameter substrates has already been difficult and very costly for equipment manufacturers implementing plasma technology. This change of size of substrates has in fact necessitated a considerable increase in the size of plasma sources whether Inductively Coupled plasma sources (or ICP) or micro-wave sources, and the addition of miscellaneous parts such as diffusers or magnets to artificially reduce the lack of uniformity. These two technologies (ICP and micro-wave) are therefore very costly today and complex for the users thereof, the manufacturers of semi-conductors. The feasibility of passage from 300 mm diameter substrates to 450 mm diameter substrates is therefore a complex problem that still remains to be solved.

Moreover, ICP and micro-wave sources attain a rate of dissociation of the gas that does not exceed 30%, which causes considerable dilution of the active species generated and very high consumption of gas. They are used in a unitary fashion: a single source is used per processing chamber and the size of the source is proportional to the volume treated. All of this imposes the implementation of voluminous sources that operate at high power, creating undesirable thermal effects on the substrates and significantly increasing the cost of these systems. Amongst these two types of sources, micro-wave plasmas are the most dense in terms of chemically active species but control of the process is difficult.

Consequently, ICP plasma technology at medium chemically active species density is dominant today.

Moreover, plasmas contain, other than free radicals that are electrically neutral, ions, electrons and UV radiation in the form of energetic photons that damage semi-conductor devices. The latter become more and more sensitive to this damage with miniaturization on the nanometer scale.

The presence of metal on the substrate (or "wafer") can produce the risk of coupling with the micro-waves and very high heating that damages the components. This is the case of ultra-sensitive structures of micro-electro-mechanical systems (also designated by the acronym MEMS), as well as three-dimensional assemblies and interconnections that will be implemented in future generations of semi-conductors.

Lastly, in the framework of the fabrication of integrated circuits, it is known to plasma process semi-conductor devices composed of an assembly of very different materials, present notably in the form of a stack of thin layers. To fabricate an integrated circuit from a semi-conductor device, the plasma processing must act on a single material, leaving the other materials of the assembly unaffected. This is what is called selectivity. This characteristic is not sufficiently raised at this time, which degrades the performance of components.

For the fabrication of integrated circuits on a silicon wafer (which is the normal base material used for fabricating integrated circuit wafers), the level of integration of the integrated circuits on the nanometer scale today imposes new technologies of surface processing with extreme sensitivity, that is without consuming the other exposed materials.

The problem of selectivity is particularly important with the use of stacks of metallic grids and dielectric grids of type "high k" and dielectric interconnection networks of type "low-k". These materials are particularly susceptible to physico-chemical modifications and loss of material.

Up until the present, a slight loss of material caused by the surface processing was tolerated as it did not have a negative impact on the performance of the circuit and the principal objective was to clean off all undesirable materials and contaminants. Today, the surface processing, in particular stripping and cleaning, can directly impact the performance of integrated circuits by the modification of dimensions and/or of materials. An additional objective for surface processings is therefore to minimize and control these modifications.

The problems of selectivity have therefore been more and more present because of the decrease of the size of integrated circuits and the use of new materials, in particular for logic components, typically microprocessors, and memory circuits.

Current plasma technologies suffer therefore from four major inconveniences: damage to the devices by ionized species, low density of chemically active species notably for ICP plasmas, low uniformity and lack of selectivity.

There exists therefore a real need for a plasma processing system compensating for these faults, inconveniences and obstacles of the prior art and in particular aiming to increase the selectivity of plasma processings and to improve the uniformity of plasma processings notably for substrates of large diameter such as 300 or 450 mm.

A person skilled in the art knows plasma processing systems using a plurality of plasma sources, such as e.g. that described in the American patent application US 2005/0178746. The system aims to improve the uniformity of the plasma processing by putting in parallel a plurality of plasma sources emitting the same chemically homogeneous plasma.

The present invention has therefore the subject matter of supplying a system for the plasma processing of an object and a process implementing such a device that will remedy these inconveniences.

To resolve these faults and inconveniences, the applicant has developed a system of plasma processing comprising a processing vacuum chamber and a plurality of plasma sources configured in independent subassemblies each generating a chemically different plasma.

More particularly, the present invention has as subject matter a system for plasma processing of an object, said system comprising:

a processing vacuum chamber comprising a support on which the object to be processed is placed; and at least two subassemblies each comprising at least one plasma source allowing a plasma to be generated, each plasma source of a subassembly being supplied independently by radiofrequency power $P_i$ and by a flow-rate $n_i$ of gas i.

According to the invention, the plasma generated by a subassembly is a partially ionized gas or gas mixture of different chemical nature from the plasma generated by the other subassembly or subassemblies.

Advantageously, each plasma source of a subassembly comprises:

a gas inlet;

a discharge chamber in a material inert to the plasma, e.g. in the form of a tube;

a device for coupling the radiofrequency (RF) power to the discharge chamber; and a gas outlet.

Advantageously, a control device controls each of the subassemblies depending upon a specific configuration by application of radiofrequency power $P_i$ and/or a flow-rate of gas $n_i$, specific to each subassembly.

Advantageously, each subassembly comprises a gas inlet specific to the subassembly connected to the gas inlet of each plasma source of the subassembly.

Advantageously, each subassembly comprises a conducting element connected to the coupling device of each plasma source of the subassembly.

Advantageously, the subassemblies are arranged as concentric rings.

Advantageously, the subassemblies are arranged in parallel.

Advantageously, in each subassembly comprising at least two plasma sources, each plasma source comprises at least two discharge chambers in series.

The present invention also has the subject matter of a selective plasma processing method for processing a composite object comprising at least two different materials A and B, said process implementing a processing system according to the invention and comprising the following steps:

a step of generating a first plasma by a first of the subassemblies and processing of the object using said first plasma;

a step of generating a second plasma by a second of the subassemblies and processing of the object using said second plasma;

By composite object, it is understood, as defined by the present invention, an assembly of materials of very different nature, being able notably to take the form of a stack of thin films. As an example of composite objects able to be processed by the process of the invention, semiconductor-devices, and in particular, silicon wafers comprising transistor structures and materials and other constituting elements of integrated circuits overlapped by one or a plurality of silicon oxide $SiO_2$ layers overlapped by silicon nitride $Si_3N_4$, can be cited.

Advantageously, the steps of generation of plasma are repeated alternately, or with a partial or total overlap, and preferably with a partial overlap of steps of at most 25%.

According to a particularly advantageous embodiment, the process according to the invention may consist of an etching treatment of the composite object, said composite object comprising at least two layers of different materials A and B, the layer of material A overlapping at least partially the layer of material B, said process comprising;

the processing using the first plasma of at least a first zone of the object comprising, on the surface, the material B, said processing using the first plasma consisting of a step of passivation or activation of material B, and the processing using the second plasma of at least a second zone of the object comprising, on the surface, the material A, said processing using the second plasma consisting of a partial or total removal of material A, that can lead to the formation of a zone comprising the material B on the surface when the removal of the material A is total, said process able to start either with a step of passivation or activation using the first plasma, or with a step of removal using the second plasma.

As an example of a composite object being selectively etched according to the process of the invention, spacers (more particularly the thinning or removal of spacers), STI ("Shallow Trench Isolation") structures (more particularly the total or partial removal "pull back" of the STI mask), transistors and advanced CMOS circuits (processors, memories) comprising layers of silicon nitride $Si_3N_4$ (material A) on layers of silicon oxide $SiO_2$ (material B) can be cited, the silicon nitride often being a sacrificial material.

This embodiment of the process of the invention presents the major advantage of allying high selectivity with a high etching speed.

Selectivity is understood in the present invention to be the ratio of the speed of etching of the target material (material A, e.g. $Si_3N_4$) to the speed of etching of another exposed material or material that can be exposed during the processing (here the material B, for example $SiO_2$), that ideally should not be etched.

This is a fundamental property of processes of removal of material (or etching) that is critical as much for "dry" type processes such as the plasma process according to the invention as for "wet" processes e.g. using phosphoric acid.

For example, the fabrication of advanced CMOS circuits (processors, memories) necessitates the removal of silicon nitride $Si_3N_4$ with very high selectivity, in particular compared to $SiO_2$ and/or Si: the removal of $Si_3N_4$ must not damage the other materials. At this time, the two processes used to perform this step of the removal of silicon nitride are on the one hand "wet" processes using phosphoric acid, and on the other hand, "dry" plasma processes with a fluorocarbon plasma containing a gas mixture $C_xF_y/H_z/O_2/H_2/N_2$. These current processes do not allow a very high selectivity in the removal of silicon nitride to be achieved as it is typically only 50.

Moreover, the fabrication of an $Si_3N_4$ spacer is done by directional etching of the previously deposited $Si_3N_4$ layer. According to the scientific research article "Plasma Etch Challenges for FinFET transistors" published by the company Lam in the journal, Solid State Technology—April 2012 (pages 15, 16, 17 and 26), the principal difficulty of current etching processes resides in obtaining a spacer with a very specific shape, without consuming the silicon substrate. The solution proposed in this article for obtaining this objective consists in modulating the plasma conditions ("time modulation of plasma parameters"). For example, sync pulsing is a technique consisting of switching on/off the power of the RF source and the RF power of the substrate carrier with a period of about 100 .mu.s. This type of directional etching is often used for the later removal of the spacer. However, such a process presents the inconvenience of inducing a loss of silicon at the foot of the spacer as well as the faceting of neighboring patterns such as the edge of the active area or the edge of the grid.

The etching process according to the invention resolves the inconveniences of the prior art and allows the allying of a high sensitivity with a high etching speed.

Advantageously the steps of processing using the first plasma and the processing using the second plasma are performed in an alternate manner according to a periodicity varying between 0.5 second and 120 seconds, and preferably from 2 to 30 seconds, so as to repeat the sequence of the plasma processing steps a plurality of times until the desired removal of material A is obtained.

Advantageously the ratio of the duration of the activation step or the passivation step to the duration of the removal step varies between 0.1 and 10 and preferably between 0.5 and 2.

The subject matter of the present invention is again an etched composite object likely to be obtained by the process of etching such as defined above. It could be notably an integrated-circuit wafer, or a substrate for a flat screen, or a substrate for solar cells, or a substrate for an electronically printed device.

BRIEF DESCRIPTION OF THE DRAWINGS

Other advantages and particularities of the present invention will result from the following description, given as a non-limiting example and made with reference to the attached figures and to the examples.

DETAILED DESCRIPTION

Figure 1:
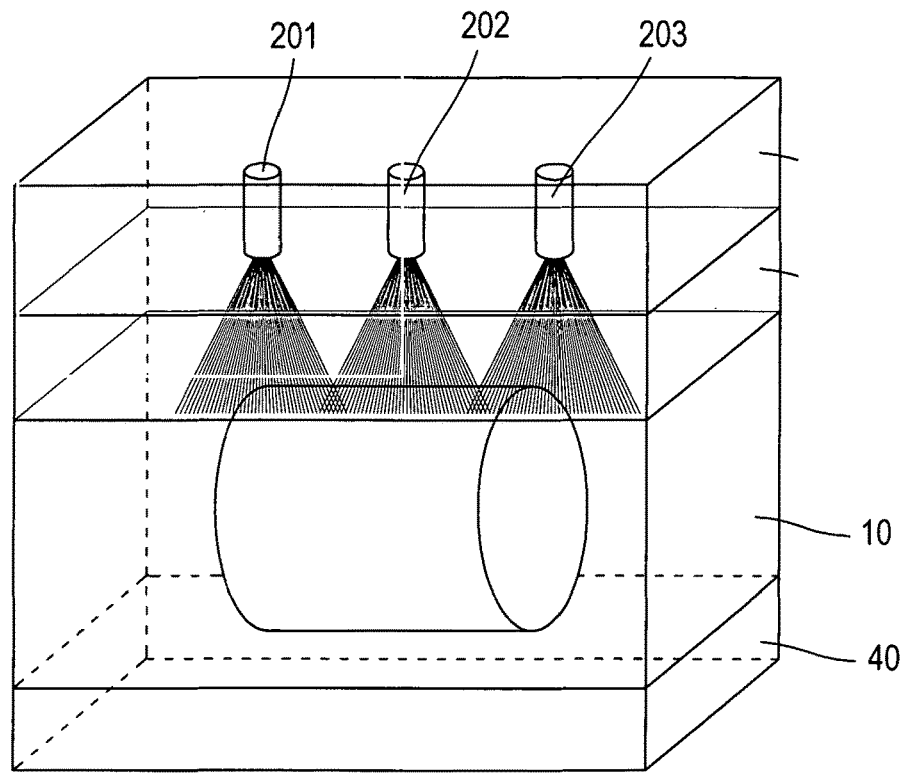
FIG. 1 is a cross-sectional functional view of a processing chamber according to an embodiment corresponding to a plasma processing system of the prior art.

Such as shown in FIG. 1, a device for plasma processing according to the prior art consists of different elements: a processing chamber 10, an assembly of plasma sources 201, 202, 203, a system of gas dispersion gas and/or of isolation of the processing chamber 10 from damaging species generated by each of the plasma sources, a gas confinement system, and a pumping system 40. The processing chamber 10 is composed of a chamber of specially processed material so as not to interact with the active species created in the plasma and with a shape adapted to the processing of the desired parts, that could be cylindrical, cubic or of another form that will allow the industrial use of the chamber. One of the faces of the processing chamber is intended for loading. It is a "door". Other faces are intended for the entry of species, it is there that the plasma sources 201, 202, 203 are attached and another face most often opposite the sources or at the base of the chamber 10 is intended for pumping the chamber.

Figure 2:
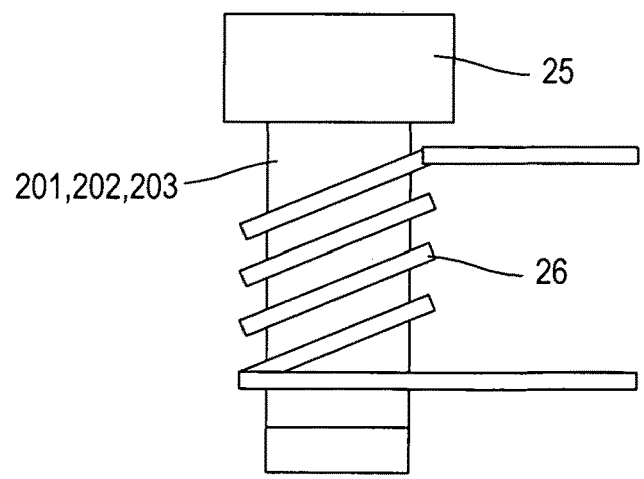
FIG. 2 is a cross-sectional functional view of a plasma source of the system shown in FIG. 1.

Each plasma source, such as represented in FIG. 2, is here composed of a gas inlet 25, a discharge chamber in the form of a tube 201, 202, 203 and a material, inert to the plasma and the diameter of which is adapted to optimize the transfer of radiofrequency power by induction via a coupling device 26 (e.g. an antenna) with several coils connected to a tuner and an RF generator upstream, and an insulating discharge capacitor downstream, not shown.

The vacuum in the processing chamber 10 necessary for the creation of the plasma and for the circulation of the gases, is obtained by pumping using a pump 40. The pump 40 is e.g. a roughing pump or a turbomolecular pump connected to the base of the chamber 10, most often facing the sources 201, 202, 203. The gas, enriched with active species, circulates in the chamber 10 before being pumped.

Figure 3:
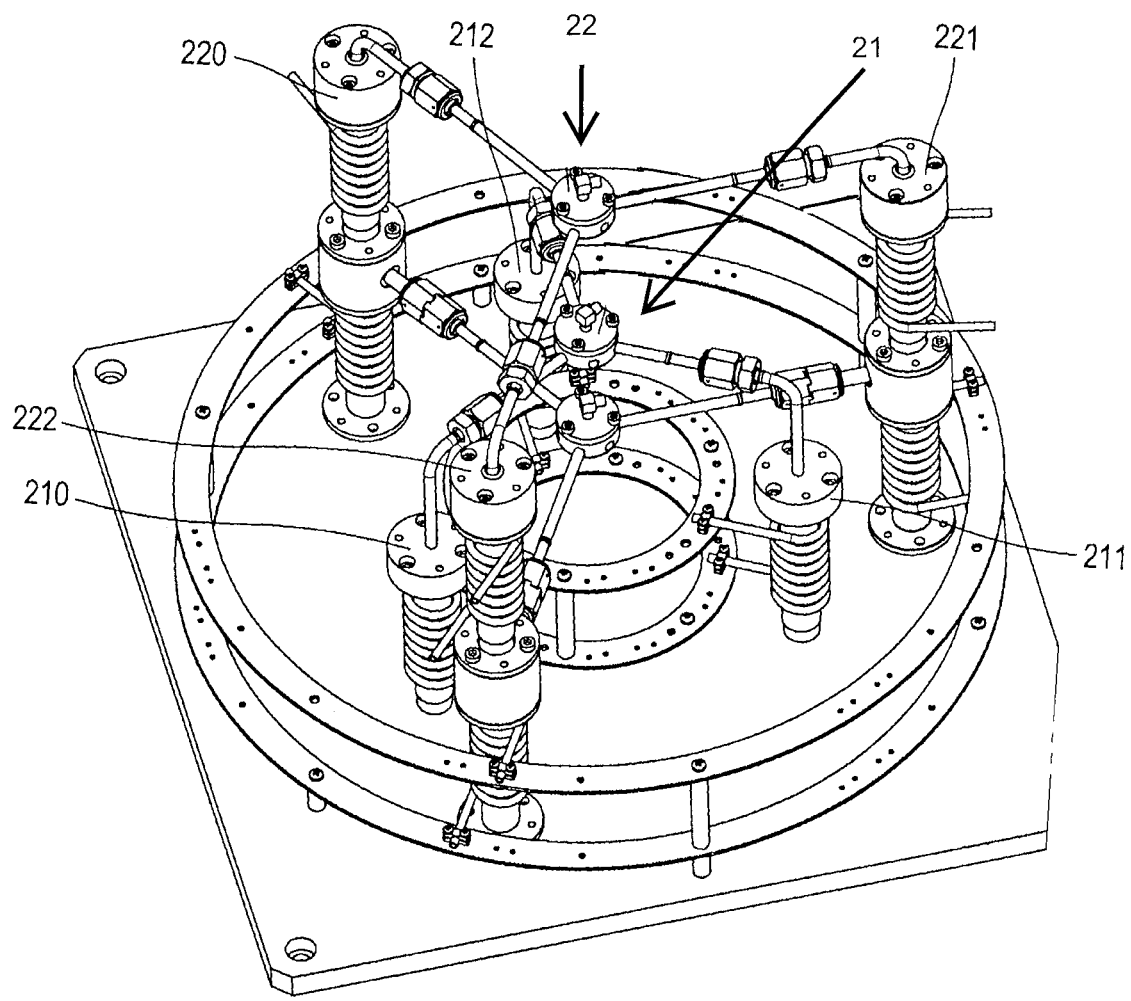
FIG. 3 is a functional perspective view of a configuration of plasma sources in two independent subassemblies according to an embodiment of the invention.

In FIG. 3, a functional perspective view of a configuration of plasma sources in two independent subassemblies 21, 22 according to an embodiment of the processing system according to the invention is shown. In the embodiment illustrated in FIG. 3, the subassemblies 21, 22 are arranged according to concentric rings. Other configurations are, however, possible depending upon the desired final result to be obtained.

Figure 4:
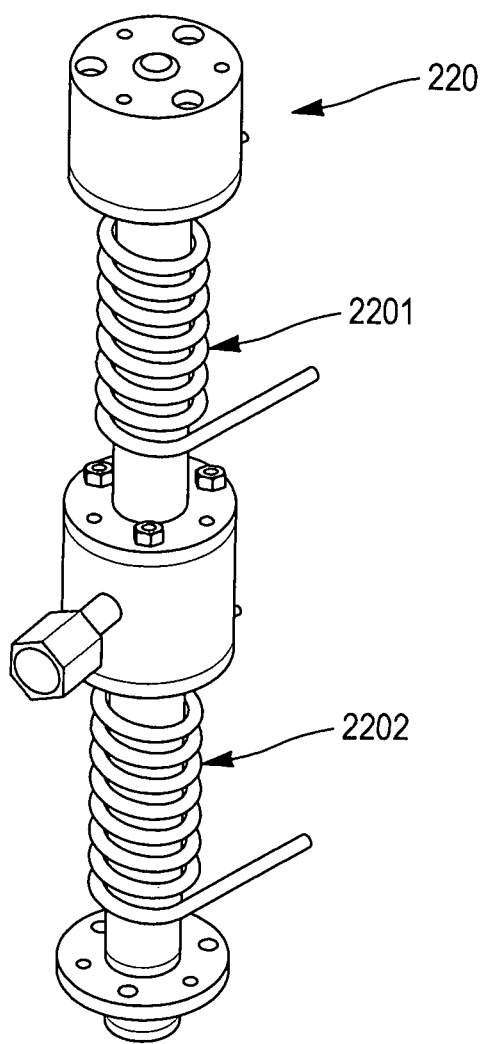
FIG. 4 is a perspective functional view of a plasma source of a system of plasma processing according to another embodiment of the invention, comprising two discharge chambers in series.

Each subassembly 21, 22 comprises at least one plasma source allowing a plasma to be generated. FIG. 3 shows that each subassembly comprises three plasma sources 210, 211 and 212 for subassembly 21 and 220, 221 and 222 for the subassembly 22). In the subassembly 21, each source comprises a single discharge chamber (here in the form of a tube), while in the subassembly 22, each source 220, 221 and 222 comprises two discharge chambers in series (also here in the form of tubes: tubes 2201 and 2202 as illustrated in FIG. 4).

Each plasma source of a subassembly is supplied independently by radiofrequency power Pi and by a gas i with flow-rate ni. The plasma generated by a subassembly (e.g. the subassembly 21) is a partially ionized gas or a gas mixture of different chemical nature from the plasma generated by the other subassembly 22.

A control device controls each of the subassemblies 21, 22 depending upon a specific configuration by application of radiofrequency power and a gas flow rate specific to each subassembly.

The plasma processing system according to the invention allows the plasma sources to be controlled independently of one another by applying a different radiofrequency power and/or gas flow-rate for each subassembly of sources, in order to be able to control the uniformity of processing, notably between the center and the edge of a part to process.

The different plasma sources 210, 211, 212, 220, 221, 222 are advantageously of small size with discharge chambers of small size, here in the form of small-diameter tubes, thus allowing their multiplication in a subassembly (in the case where a source comprises a single discharge chamber, here in the form of a tube) or the multiplication of sources (in the case where a source comprises discharge chambers in series).

The multiplication of sources in addition allows the number of active species generated by said subassembly in the processing chamber to be increased. It also allows the processing to be optimized and homogenized even for large-diameter wafers. In fact, by the adequate combination of the diffusion cones of the sources, using their overlap and/or their superposition, and by the management of the circulation of gas via the pumping of the chamber, it is possible to obtain a uniform processing of the surfaces.

On the other hand, these plasma sources can be placed in different strategic places so as to correspond to the form to be processed, for the optimization of its processing or the uniformity of its processing.

With regard to the configuration of the plasma sources in independent subassemblies, their small bulk, and the independent management of the subassemblies, both in gas and in radiofrequency power, it is possible to allocate, in the plasma processing system, different subassemblies to different geometrical zones in the processing chamber. These zones being independent from one another, they are more or less activated, both in gas and radiofrequency power, so as to allow control of the action of the localized activated species in the processing chamber 10.

Thus, in working by zone and with independent subassemblies, the geometry of the process is actively controlled.

Not only does this arrangement allow the uniformity of the process to be controlled across the substrate, but the process can be developed without limit for the size of the object to process, in particular for the diameter of wafers from 300 mm to 450 mm, by adding additional peripheral zones one after the other.

For substrates or wafers of 300 mm diameter, a processing system can be used comprising, for example, two subassemblies arranged in two concentric rings, as illustrated in FIG. 3.

The central ring (first subassembly) 21 is here comprised of three discharge chambers (here in the form of tubes 210, 211 and 212) comprising plasma sources (generally between one and six discharge chambers) arranged in the center of the source and supplied by radiofrequency power P1 and by a gas comprised of a mixture of, e.g., O2, Ar, CF4, CHF3, NF3, H2O, H2, Cl2, CF3Br, CXHyFZ, etc., mixed in a block, where the block implements a mixing operation with a gas 1 of flow-rate 1.1, a gas 2 of flow-rate 2.1, a gas 3 of flow-rate 3.1, etc. up to a gas n of flow-rate n.1.

A second ring 22 surrounds the central ring, that is comprised of, for example, three sources (but preferably between four and eight sources), each comprising two discharge chambers in series, the ring 22 being concentric with the central ring 21. The different discharge chambers (here in the form of tubes) of the ring 22 are supplied by radiofrequency power P2 and by a gas mixed in a block, here a mixture of e.g. gaseous O2, Ar, CF4, CHF3, NF3, H2O, H2, Cl2, CF3Br, CXHyFZ, etc., where the block implements a mixing operation with a gas 1 of flow-rate 1.2, a gas 2 of flow-rate 2.2, a gas 3 of flow-rate 3.2, etc. up to a gas n of flow-rate n.2.

It is possible also to use three or more zones, in 300 mm.

For wafers of 450 mm in diameter, one or several concentric rings of plasma sources can advantageously be added (each ring corresponding to a subassembly) to those already existing depending upon the requirements of uniformity, using the same principle.

For example, a third ring can be used, surrounding the ring 22 previously described, this ring comprising eight to sixteen discharge chambers (here in the form of tubes), the tubes being supplied by radiofrequency power P3 and by gases mixed in a block, said gases being for example O2, Ar, CF4, CHF3, NF3, H2O, H2, Cl2, CF3Br, CXHyFZ, etc., where the block implements a mixing operation with a gas 1 of flow-rate 1.3, a gas 2 of flow-rate 2.3, a gas 3 of flow-rate 3.3, etc. up to a gas n of flow-rate n.3.

The uniformity of the processes is ensured by the independent control of different zones of the source in terms of gas flow-rate F1, F2, F3 and radiofrequency power P1, P2, P3.

For that, each ring corresponds to a subassembly of sources, which subassembly comprises a gas inlet that is specific to said subassembly, connected to the gas inlet of each plasma source of the subassembly considered. A control device controls the flow-rate of gas in the gas inlet of each subassembly. The control device additionally controls the mixture of gas injected in the gas inlet of each subassembly.

In terms of electrical implementation, each subassembly comprises here a conducting element connected to the antenna 26 of each discharge chamber (here in the form of a tube) of the subassembly. The control device controls the radiofrequency power supplied to the conducting element of a subassembly.

According to an advantageous arrangement, in addition, the substrate is turned to average the speed of processing and thus to improve uniformity.

According to another advantageous arrangement, concentric rings in anodized aluminum or quartz are typically added between each source and the substrate to process, typically in the upper part of the processing chamber 10, these rings being showerheads, such showerheads being used currently in semi-conductor fabrication equipment, to distribute the injection of chemical species over hundreds of injection points. Such rings are formed, with small holes pierced into the lower face thereof, opposite the substrate to process. In the present case, they allow the uniformity of the processing to be improved even more and even reduce the number of discharge chambers necessary to process a substrate of 300 mm and 450 mm.

According to another advantageous arrangement, the parameters of the gas flow-rate and radiofrequency power are adjusted from a measurement of the performance in terms of uniformity of the process.

Using a device for measuring the local performances of the process, whether for example directly by spectroscopy or indirectly by thickness measurement, it is possible, by multiplexing the sources, to actively correct the process so as to optimize the quality of the processing in terms of speed, of homogeneity and of uniformity while guaranteeing the innocuousness of the processing.

Such an adjustment of parameters of gas flow and of radiofrequency power is e.g. performed in the form of a closed cycle or in the form of a feed forward cycle.

A feed forward adjustment consists here in measuring the state of the surface of the wafer prior to processing (such as e.g. the thickness of the resin) so as to adjust the processing parameters to compensate for the non-uniformity already present.

The closed cycle consists here of measuring the state of the surface of the wafer following processing in order to adjust the process parameters before processing the following wafer.

The advantages brought by the plasma processing system described are notably a better uniformity and a better efficiency in terms of processing speed. In addition, the multiplexing of sources allows independent control of the flow of active species in terms of quantity, dissociation rate, chemical composition and of energy over certain work zones and thus allows the processing of sensitive components to be actively corrected. The system, therefore, allows substrates to be processed without limit of size, which procures a very large potential of applications, beyond the applications of cleaning and stripping.

The system also allows a uniform distribution of the gaseous flux of active species to be obtained. It allows the efficiency of residue cleaning and etching speeds to be improved, while increasing considerably the selectivity compared to current performances.

The selectivity is the ratio of the etching speed of the target material (e.g. silicon nitride $Si_3N_4$) to the etching speed of another exposed material, that ideally must not be etched (e.g. silicon oxide $SiO_2$). Selectivity is critical and must be constantly increased, with the appearance of new generations of technology. The device, with the multiple discharge chambers thereof, (here in the form of tubes) allows the selectivity of plasma processes to be increased by independently controlling the etching speed of the target material and that of one or more other exposed materials. The device allows infinite selectivity to be obtained.

In particular, the alternate use or partial overlap of a stripping plasma generated by a subassembly and of a passivation plasma generated by another subassembly allows this selectivity to be substantially increased.

EXAMPLES

Products
Silicon semiconductor substrates (wafers), overlapped by a layer of silicon nitride ($Si_3N_4$) as target material to be etched, and by a layer of silicon oxide $SiO_2$ as material not to be etched, or by composite zones of the preceding materials;
Silicon semiconductor substrates (wafers), overlapped by a layer of silicon oxide $SiO_2$ (material not to be etched) overlapped by a layer of $Si_3N_4$ (target material to be etched);
Silicon semiconductor substrates (wafers) comprising composite zones of the preceding stacks
Test: Measurement of Selectivity
The selectivity is measured by taking the ratio, after processing, of the thickness removed from material A compared to the thickness removed from material B for the same processing time. This can also be expressed in the form of the ratio of the etching or stripping speeds of the two materials.

Comparative Example 1

Substrates of silicon overlapped by a layer of silicon nitride ($Si_3N_4$) and substrates of silicon overlapped by a layer of silicon oxide ($SiO_2$) have been respectively etched by phosphoric acid wet processing.
Results
A selectivity of 50:1 was obtained.

Comparative Example 2

In order to determine the etching speed of $SiO_2$, an Si substrate covered only in $SiO_2$ is used, i.e. $SiO_2$/Si, from which $SiO_2$ is partially removed. In order to determine the etching speed of $Si_3N_4$ an Si substrate covered only in $Si_3N_4$ is used, i.e. $Si_3N_4$/Si or most frequently an Si substrate with $Si_3N_4$ on $SiO_2$ i.e. $Si_3N_4$/$SiO_2$/Si, from which $Si_3N_4$ is partially removed.

The process is then applied to the real structure on an Si substrate. The real structure is most often a composite, that is to say made of $SiO_2$ zones and $Si_3N_4$/$SiO_2$ zones. The geometry and the topography of the zones depend on the fabrication step (FIG. 15 is an example thereof).

Figure 5:
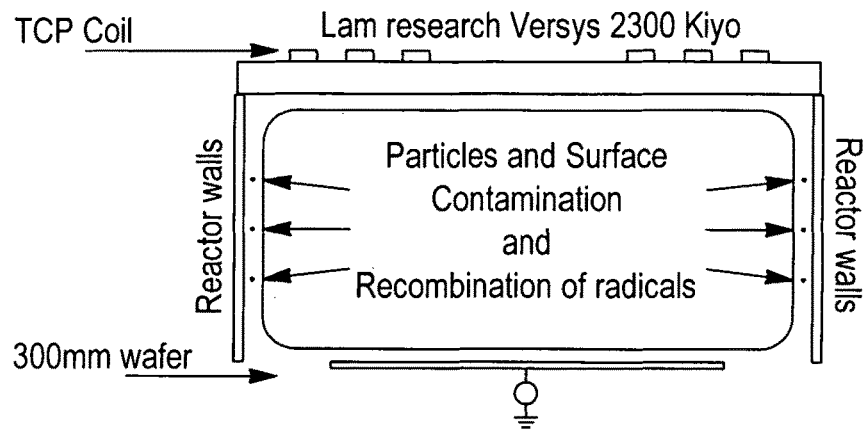
FIG. 5 shows a plasma etching machine of the prior art, that is implemented in the comparative example 2.

Test wafers such as described above were etched by the plasma process of the prior art presented by the IMEC R&D Centre (Belgium) during the PESM 2012 conference in Grenoble. The plasma etching processing was performed in an etching machine of the company Lam Research such as illustrated in FIG. 5: it comprises a single discharge chamber and a single chemistry.

Results plasma (gas mixture used) $NF_3$/$O_2$/$CH_3F$
Speed v1 of etching of $Si_3N_4$ 44 nm/min
Speed v2 of etching of $SiO_2$ 0.8 nm/min
Selectivity v1/v2 55:1

Comparative Example 3

Figure 6:
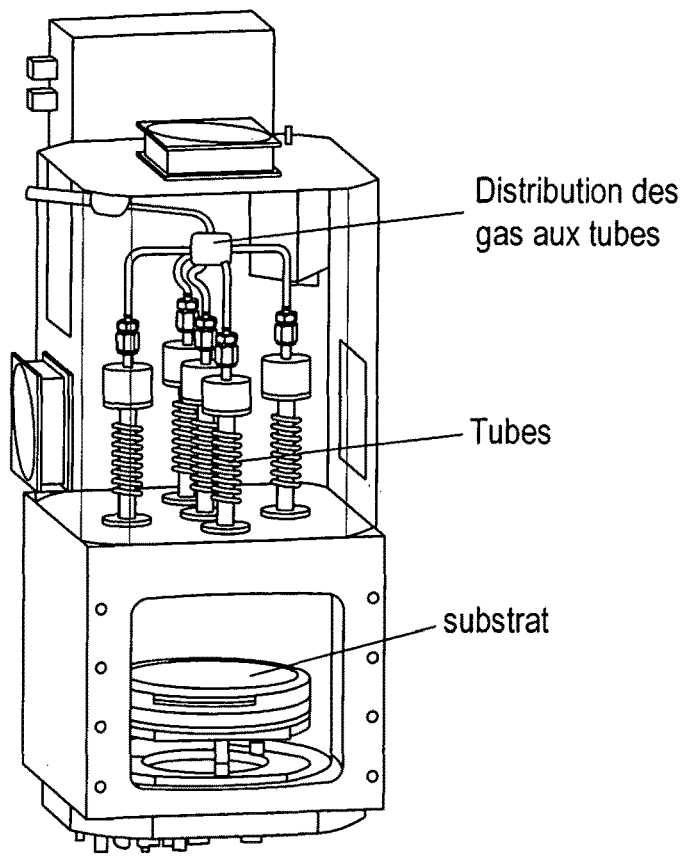
FIG. 6 shows another plasma etching machine of the prior art, that is implemented in the comparative example 3.

The applicant has performed selective etching experiments of $Si_3N_4$ based on equipment comprising a plasma source comprised of several discharge chambers (here in the form of tubes) such as illustrated in FIG. 6. In this device, the discharge tubes are all connected in parallel and controlled by a single generator. It was not possible to independently control the tubes, that is, to apply a different RF power to the different tubes. The active gases of type $O_2$, $N_2$, $CF_4$, etc. are mixed prior to being injected into the discharge tubes. It was also not possible to inject different gases into different tubes. The plasma source used by the applicant, while being composed of a plurality of discharge tubes, generates a single type of plasma in the processing chamber, just like traditional plasma sources (micro-wave or by inductive coupling).

Figure 7:
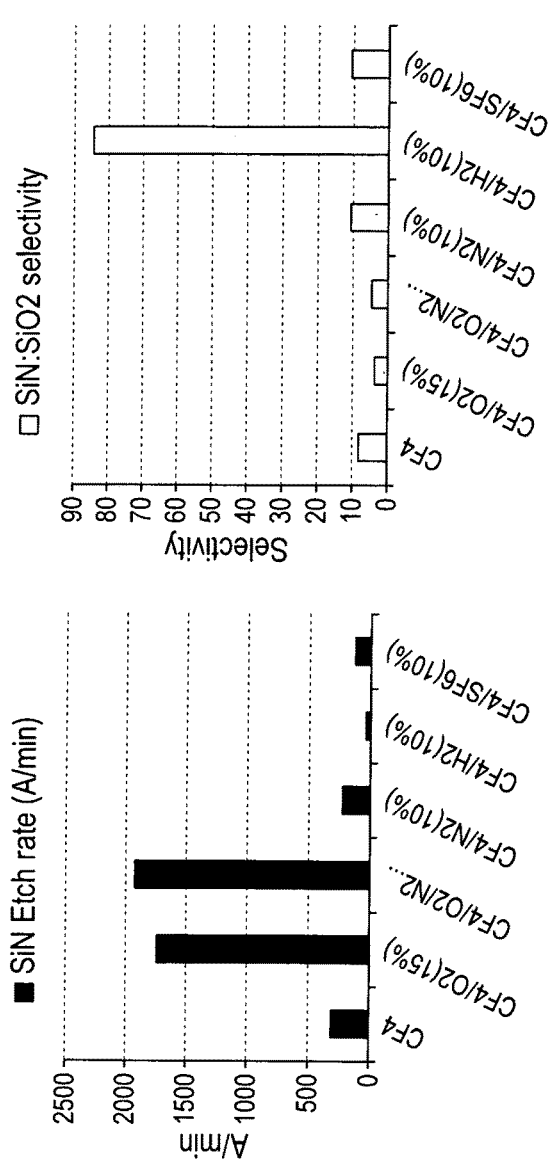
FIG. 7 shows the selectivity and etching speed obtained by the process implementing the machine of FIG. 6 (comparative example 3)

FIG. 7 demonstrates the selectivity and the etching speed as a function of different gas mixtures. This figure shows that:

the addition of $O_2$ is the principal parameter for increasing the etching speed of $Si_3N_4$; and the addition of $H_2$ greatly improves the $Si_3N_4$:$SiO_2$ selectivity, but the etching speed of $Si_3N_4$ remains low.

Figure 8:
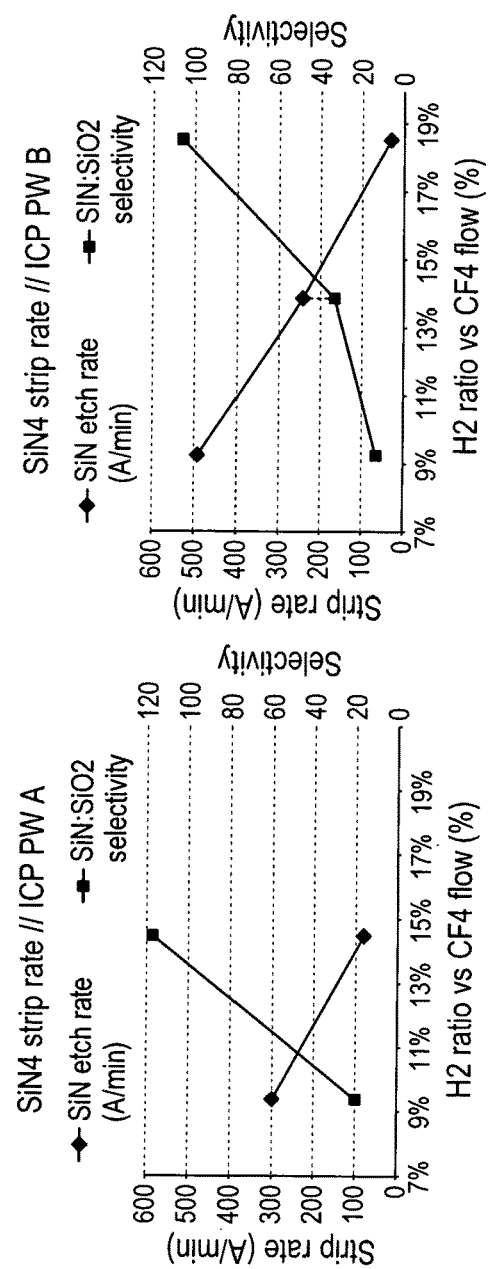
FIG. 8 shows the evolutions of the etching speed and of the selectivity as a function of the gas mixture measured during the process implemented in the comparative example 3.

FIG. 8 demonstrates the selectivity and the etching speed as a function of the amount of $H_2$ in the gas mixture. It is noted that:

the etching speed of $Si_3N_4$ and the $Si_3N_4$:$SiO_2$ selectivity are closely correlated: the etching speed of $Si_3N_4$ decreases when the $SiO_2$ selectivity increases. It is not possible to de-correlate the two in a traditional plasma source configuration (that is, generating a single type of plasma in the processing chamber);

the etching speed of $Si_3N_4$ is about 80 .ANG./min for a selectivity $Si_3N_4$:$SiO_2$ of 110:1;

the etching speed of $Si_3N_4$ is about 250 .ANG./min for a selectivity $Si_3N_4$:$SiO_2$ of about 35:1.

Comparative examples demonstrate therefore that it is not possible to ally high selectivity with high etching speed (see the results presented in FIG. 8 and comparative example 2).

Example 1 According to the Invention

Substrates of silicon covered in silicon oxide and/or covered in silicon nitride ($Si_3N_4$/$SiO_2$) such as previously described, were etched using the plasma etching process according to an embodiment of the invention, comprising the repetition of the two following fundamental steps until obtaining the desired result:

passivation step: it serves to protect (or "passivate") certain surfaces from chemical attack taking place during the etching step. Passivation consists of depositing, onto the substrate, a polymer of type e.g. $C_xF_yH_z$ (e.g. $CF_4$, or $C_4F_8$ or $C_2F_6$, $CHF_3$, $CH_3F$, etc.), removal or etching step: It serves to remove ("etch") a material, either partially or entirely. During step 2, the passivation layer can be partially or entirely removed, the duration of each step being of the order of several seconds if not several tens of seconds but also could be extremely short, of the order of 0.1 s.

Figure 9:
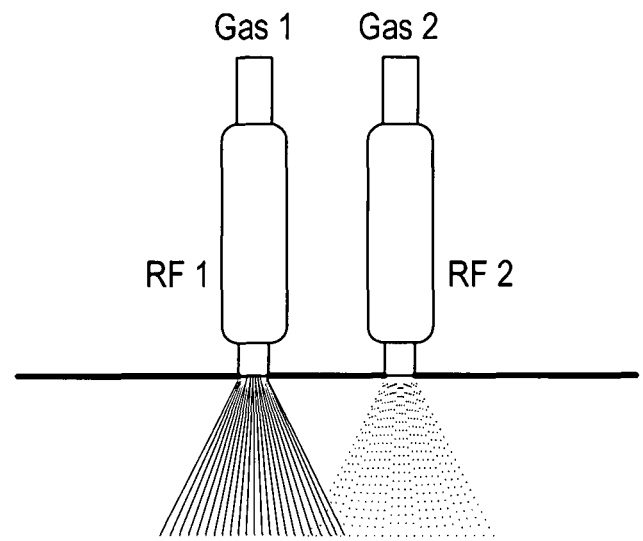
FIGS. 9 and 10 show the use of two plasma source assemblies of the device according to the invention implemented in the examples according to the invention.
Figure 10:
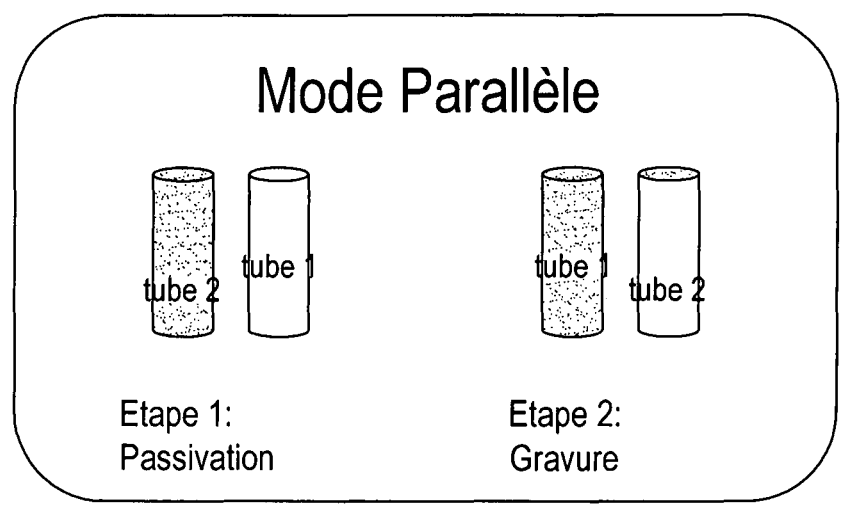
Figure 11A:
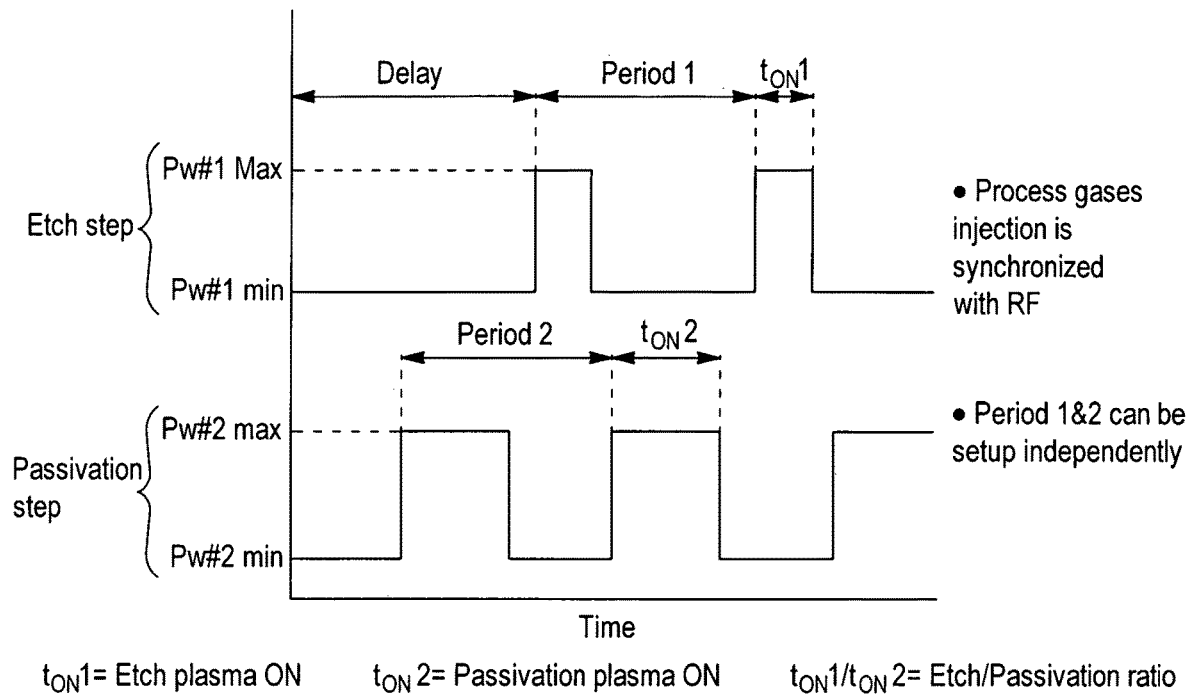
FIGS. 11A, 11B, 11C shown the timing chart of the operation of the two subassemblies of FIG. 10.
Figure 11B:
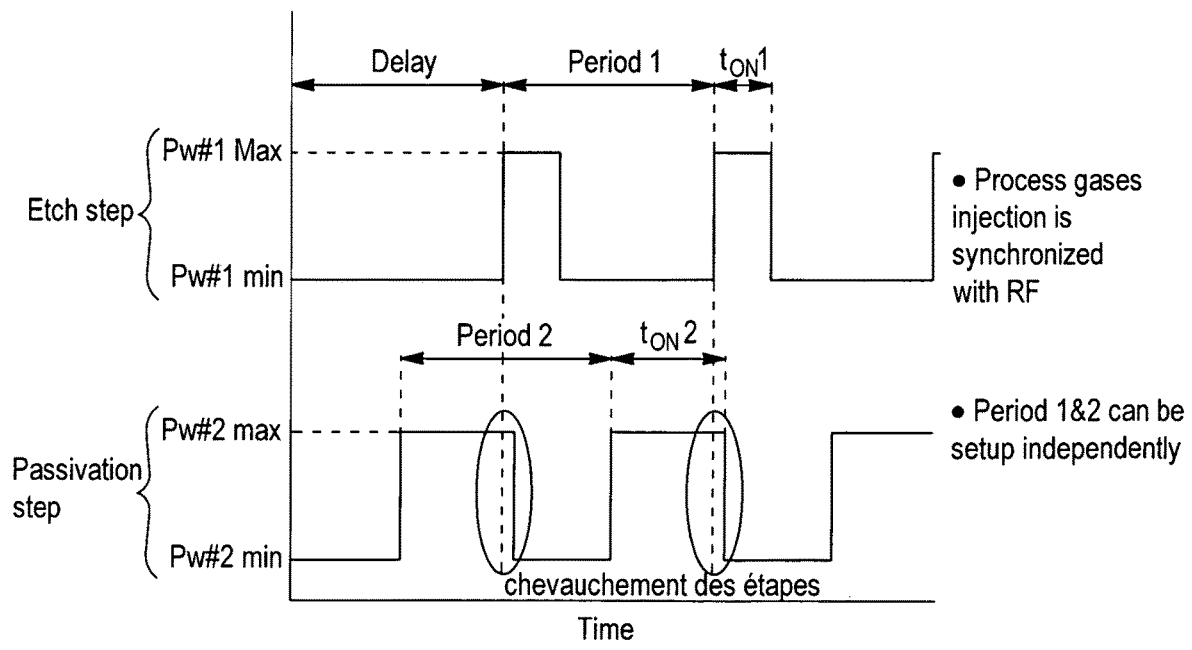
Figure 11C:
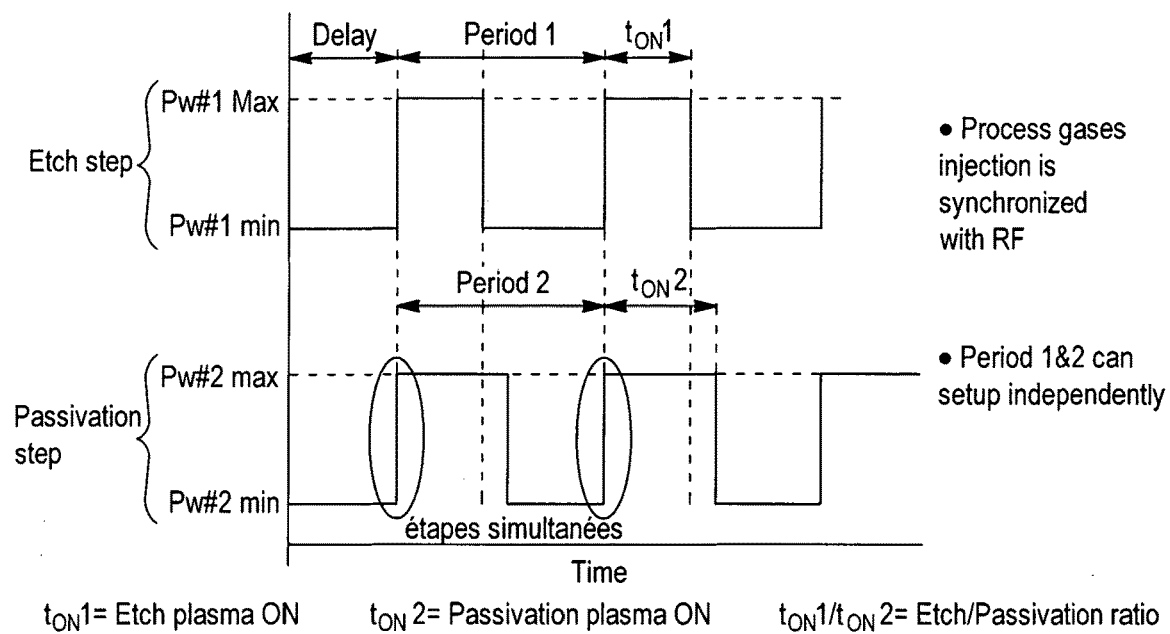

This process is implemented using a plasma processing device according to the invention comprising two subassemblies of different plasma sources (here represented by tubes 1 and 2 in FIG. 9), each tube performing a step (passivation or etching) of the invention (as illustrated in FIG. 10). The time charts of the operation of each source are shown in FIGS. 11A, 11B and 11C, respectively for an operation with alternating steps of removal and passivation with no overlap, (FIG. 11A), for an operation with steps of removal and passivation with partial overlap (FIG. 11B) and steps of removal and passivation with total overlap (FIG. 11C).

Figure 12:
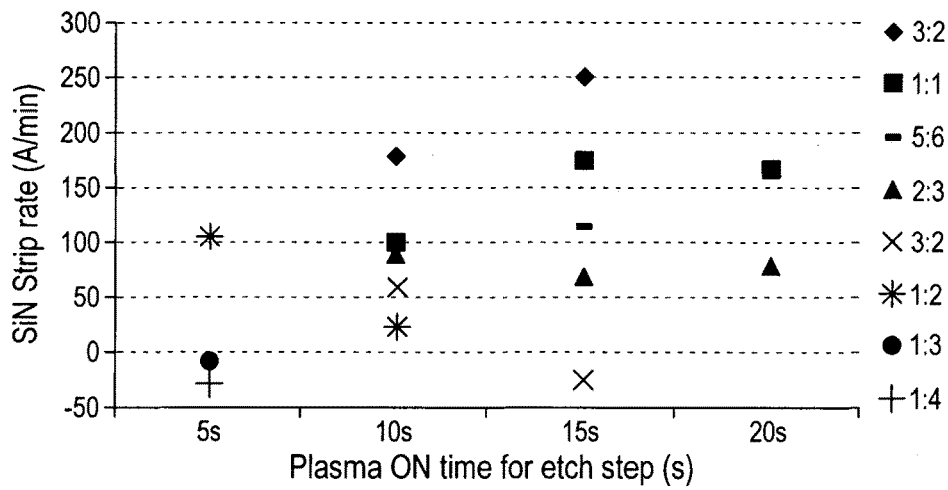
FIGS. 12 to 14 show the results obtained with the process described in the examples according to the invention and implementing the device shown schematically in FIGS. 9 and 10.
Figure 13:
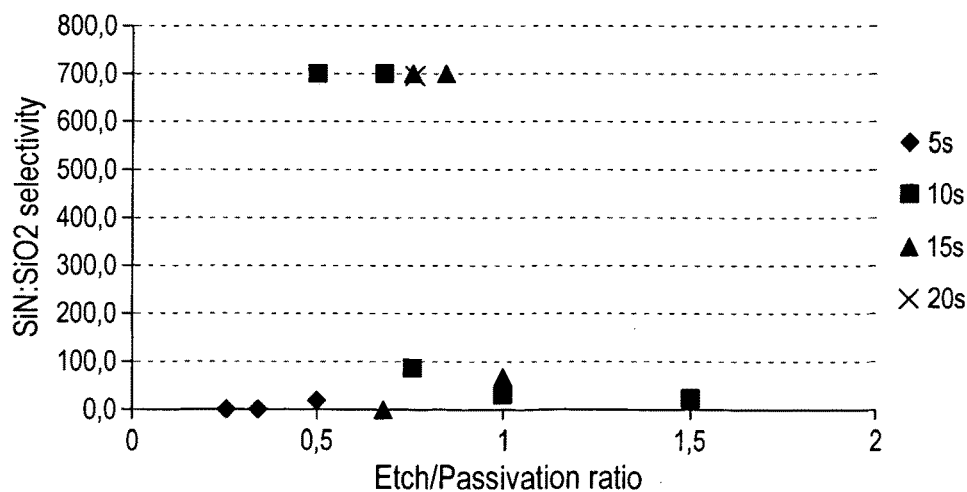
Figure 14:
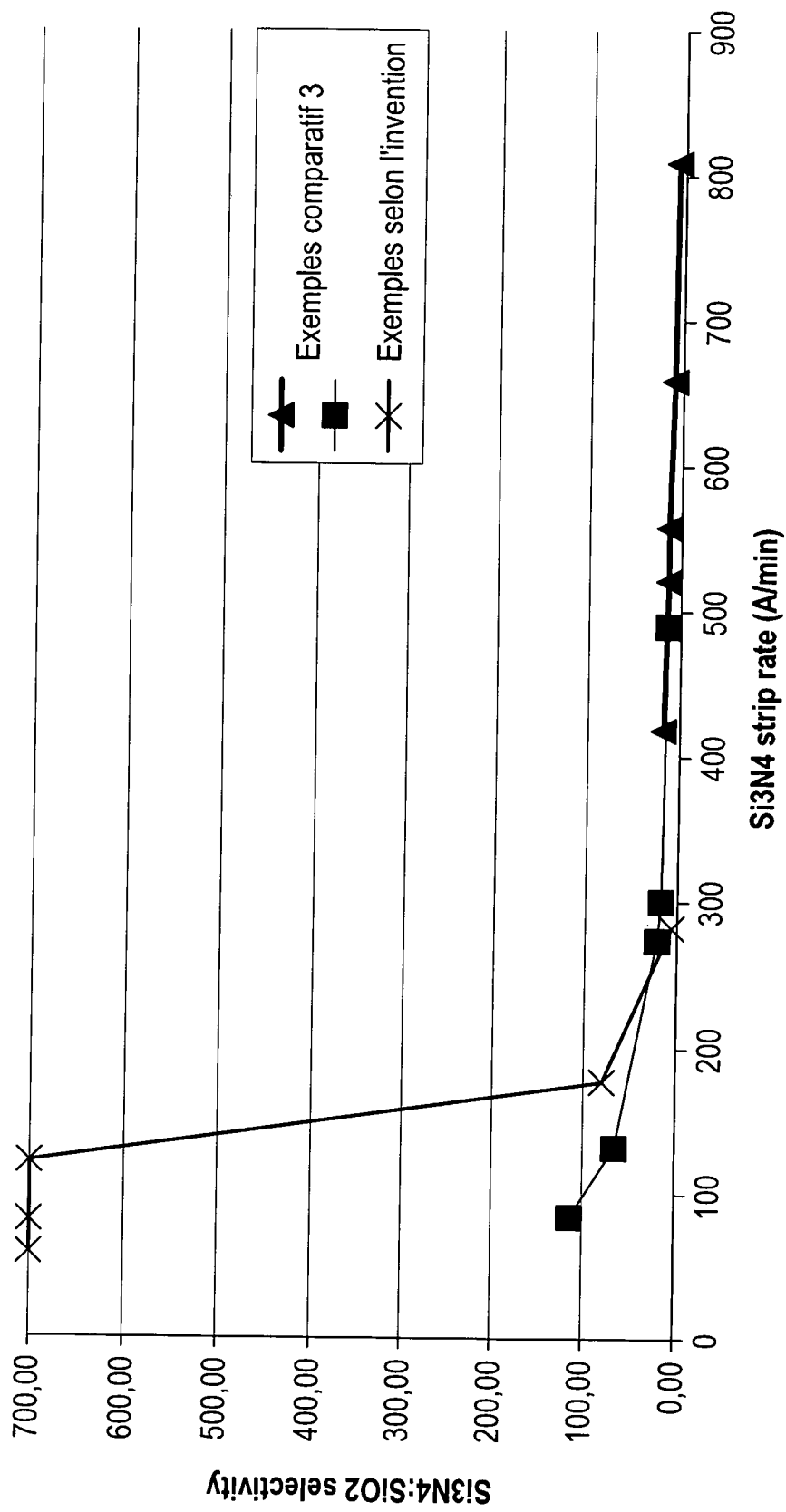

As shown in FIGS. 12 to 14, the process described allows the etching speed of $Si_3N_4$ to be controlled without apparent consumption of $SiO_2$;

the etching speed of $Si_3N_4$ is about 120 .ANG./min for a selectivity $Si_3N_4$:$SiO_2$ of about 700:1 with a $CF_4$/$O_2$/$H_2$ plasma.

These tests demonstrate therefore that the plasma etching process according to the invention allows the speed of etching of $Si_3N_4$ and that of $SiO_2$ to be controlled independently and thus very high selectivity to be obtained.

The experimental conditions of the etching tests according to the invention are detailed below and illustrated in FIGS. 11A, 11B and 11C.

| Processes used per tube: values | | Min | Max |
| --- | --- | --- | --- |
| Passivation step (Tube 2) | | | |
| Conditions 1 | | | |
| RF power = | 120 W | 80 | 360 |
| Flow-rate $CF_4$ = | 40 sccm | 20 | 80 |
| Flow-rate $H_2$ = | 13.5 sccm | 5 | 30 |
| $tON_2$ = | 20 sec | 2 | 35 |
| Period 2 = | 35 sec | 3 | 80 |
| Conditions 2 | | | |
| RF power = | 360 W | 120 | 360 |
| Flow-rate $C_4F_8$ = | 45 sccm | 20 | 50 |
| Flow-rate $O_2$ = | 5 sccm | | 20 |
| $tON_2$ = | 20 sec | | 35 |
| Period 2 = | 35 sec | | 80 |
| Conditions 3 | | | |
| RF power = | 240 W | 120 | 360 |
| Flow-rate $C_2F_6$ = | 30 sccm | 30 | 70 |
| Flow-rate $O_2$ = | 0 sccm | 0 | 5 |
| tON2 = | 20 sec | 2 | 35 |
| Period 2 = | 35 sec | 3 | 50 |
| Removal step (Tube 1) | | | |
| Conditions 1 | | | |
| RF power = | 120 W | 120 | 360 |
| Flow-rate $CF_4$ = | 40 sccm | 20 | 80 |

-continued

| Processes used per tube: values | | Min | Max |
|---|---|---|---|
| Flow-rate $O_2$ = | 5 sccm | 0 | 10 |
| tON1 = | 15 sec | 1 | 35 |
| Period 1 = | 35 sec | 3 | 85 |
| Conditions 2 | | | |
| RF power = | 240 W | 120 | 360 |
| Flow-rate $CHF_3$ = | 40 sccm | 0 | 100 |
| Flow-rate $O_2$ = | 30 sccm | 0 | 60 |
| tON1 = | 15 sec | 1 | 35 |
| Period 1 = | 35 sec | 3 | 85 |

Other Parameters:
  Temperature of substrate=between 135° C. and 150° C.
  Pressure=200 mTorr to 1 Torr
  Total processing time=from 1 min to 3 min
  RF power=50 to 1000 W/discharge tube and up to 5000 W for a subassembly composed of a plurality of discharge tubes.
  Gas flow-rate=1 sccm to 5000 sccm
  tON=0.1 sec to 30 sec Other Plasma Gases that can be Used in the Frame of the Present Invention:
  for the passivation step: $CF_4$, $CHF_3$, $CH_3F$, $C_2F_6$, $C_4F_8$, $CF_3Br$, HBr with or without $H_2$, with or without $N_2$, and their mixtures
  for the etching step: $CF_4$, $CHF_3$, $CH_3F$, $NF_3$, $Cl_2$, HBr, $SF_6$, with or without $O_2$, with or without $N_2$, and their mixtures
  Additive gases: $O_2$, $N_2$, Ar, $H_2$, Xe, He Example 2

According to the Invention

From substrates composed of silicon covered by silicon oxide and/or covered in silicon nitride, the silicon nitride $Si_3N_4$ layer, serving as a mask for the fabrication of composite so-called STI (shallow trench isolation) structures, was selectively etched.

Figure 15B:
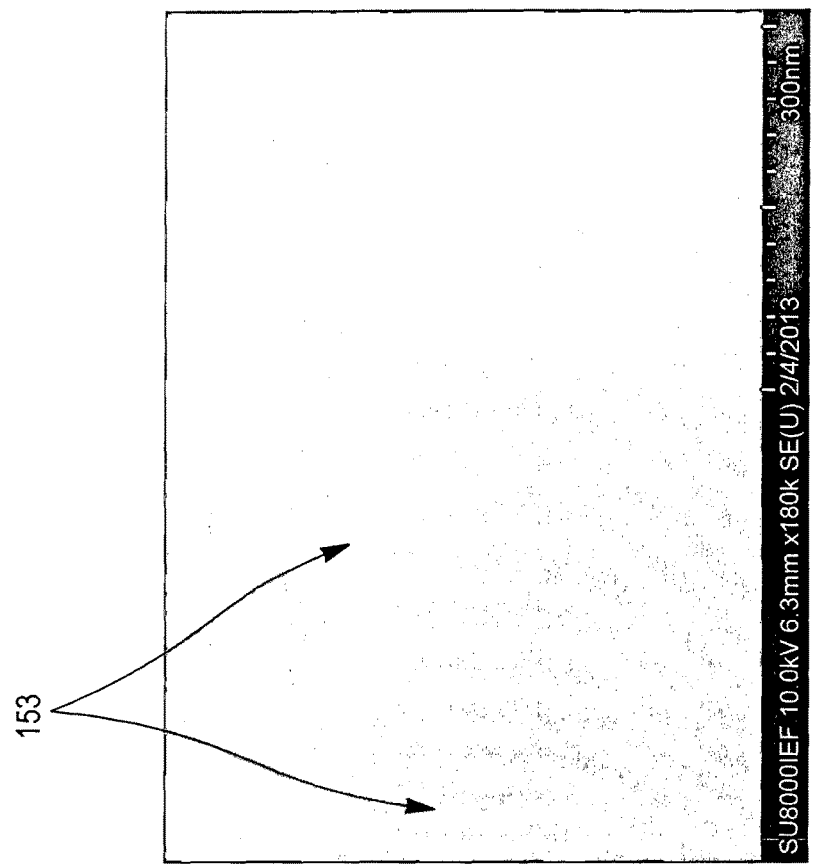
FIGS. 15A and 15B show the result of the etching according to the process described on a silicon oxide layer overlapped with silicon nitride for the fabrication of insulating composite structures.
Figure 15A:
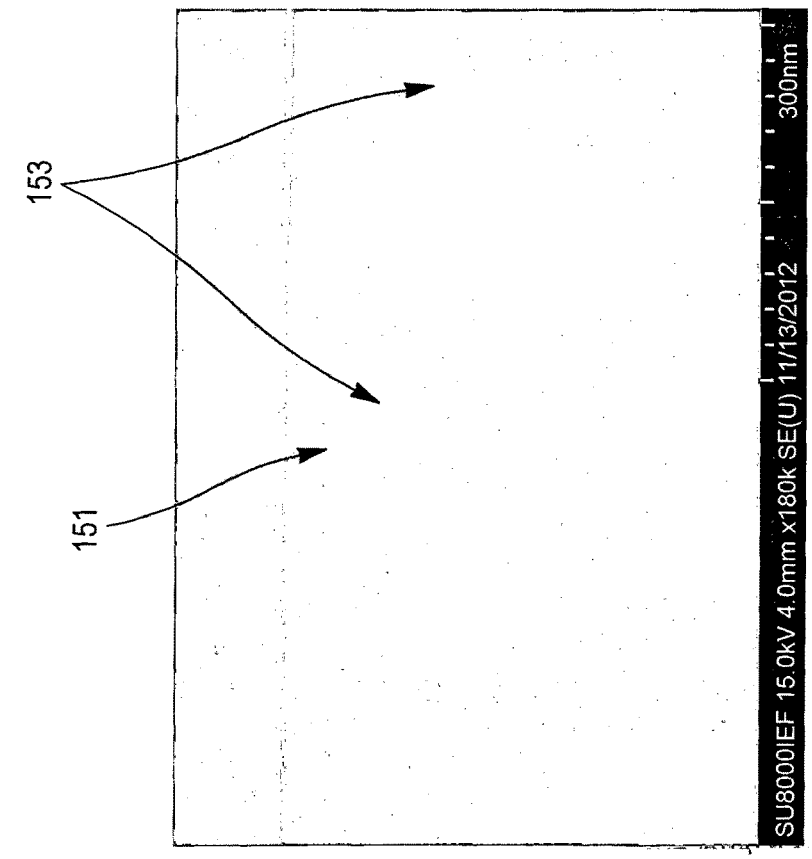

To do this, the sequence of steps of passivation and removal implementing conditions 1 of example 1 was repeated eight times, for a period of 7 and 15 seconds respectively. The composite structure before the removal is illustrated in FIG. 15A (left), while that after processing is illustrated in FIG. 15B (right). Silicon nitride $Si_3N_4$ is referenced as 151 and silicon oxide as 153. A suppression of silicon nitride is noted while the silicon oxide is intact.

What is claimed is:

1. A processing system for the treatment of an object by plasma comprising:
   a treatment vacuum chamber having a support on which the object to be treated is placed;
   a first subassembly having at least three plasma sources; and
   a second subassembly having at least three other plasma sources, the first subassembly and the second subassembly are arranged as concentric rings, said second subassembly is superimposed over said first subassembly;
   each of the first and second subassembly having the three plasma sources each being supplied independently with radio frequency power and gas, the plasma generated by the at least three plasma sources of the first subassembly is from a gas of different chemical nature from the plasma generated by the at least three plasma sources of the second subassembly.

2. The processing system according to claim 1 wherein each plasma source of the first subassembly comprises two discharge chambers in series and each plasma source of the second subassembly comprises two discharge chambers in series.

3. The processing system according to claim 1 wherein the second subassembly surrounds the first subassembly.

* * * * *